United States Patent
D'Abreu et al.

(10) Patent No.: US 8,321,727 B2
(45) Date of Patent: Nov. 27, 2012

(54) SYSTEM AND METHOD RESPONSIVE TO A RATE OF CHANGE OF A PERFORMANCE PARAMETER OF A MEMORY

(75) Inventors: Manuel Antonio D'Abreu, El Dorado Hills, CA (US); Stephen Skala, Fremont, CA (US); Dana Lee, Saratoga, CA (US)

(73) Assignee: Sandisk Technologies Inc., Plano, TX (US)

( * ) Notice: Subject to any disclaimer, the term of this patent is extended or adjusted under 35 U.S.C. 154(b) by 757 days.

(21) Appl. No.: 12/494,222

(22) Filed: Jun. 29, 2009

(65) Prior Publication Data

US 2010/0332923 A1  Dec. 30, 2010

(51) Int. Cl.
*G11C 29/00* (2006.01)
(52) U.S. Cl. .......................................... 714/718; 714/47
(58) Field of Classification Search ............... 700/79; 365/185.17; 324/439, 426; 714/47, 764, 714/704, 710, 758, 718
See application file for complete search history.

(56) References Cited

U.S. PATENT DOCUMENTS

| | | | |
|---|---|---|---|
| 4,964,129 A * | 10/1990 | Bowden et al. | 714/764 |
| 5,233,610 A * | 8/1993 | Nakayama et al. | 714/704 |
| 5,475,693 A * | 12/1995 | Christopherson et al. | 714/710 |
| 6,415,189 B1 * | 7/2002 | Hajji | 700/79 |
| 6,895,464 B2 | 5/2005 | Chow et al. | |
| 7,558,113 B2 * | 7/2009 | Kawamoto et al. | 365/185.17 |
| 7,928,735 B2 * | 4/2011 | Huang et al. | 324/426 |
| 2003/0037280 A1 * | 2/2003 | Berg et al. | 714/6 |
| 2003/0037299 A1 | 2/2003 | Smith | |
| 2006/0062048 A1 | 3/2006 | Gonzalez et al. | |
| 2006/0129611 A1 * | 6/2006 | Adkins et al. | 707/202 |
| 2007/0180328 A1 | 8/2007 | Cornwell et al. | |
| 2007/0198786 A1 | 8/2007 | Bychkov et al. | |
| 2007/0201274 A1 | 8/2007 | Yu et al. | |
| 2008/0082725 A1 | 4/2008 | Elhamias | |
| 2008/0301524 A1 | 12/2008 | Horisaki et al. | |
| 2008/0307270 A1 * | 12/2008 | Li | 714/47 |
| 2009/0027056 A1 * | 1/2009 | Huang et al. | 324/439 |
| 2009/0070651 A1 | 3/2009 | Diggs et al. | |
| 2009/0150748 A1 * | 6/2009 | Egner et al. | 714/758 |
| 2009/0157952 A1 | 6/2009 | Kim et al. | |

OTHER PUBLICATIONS

International Search Report and Written Opinion dated Apr. 20, 2011, issued in International Application No. PCT/US2010/039710, 19 pages.

* cited by examiner

*Primary Examiner* — David Ton
(74) *Attorney, Agent, or Firm* — Toler Law Group, PC

(57) ABSTRACT

Systems and methods are disclosed that are responsive to a rate of change of a performance parameter of a memory. In a particular embodiment, a rate of change of a performance parameter of a non-volatile memory is determined. The rate of change is compared to a threshold, and an action is performed in response to determining that the rate of change satisfies the threshold.

38 Claims, 10 Drawing Sheets

SYSTEM AND METHOD RESPONSIVE TO A RATE OF CHANGE OF A PERFORMANCE PARAMETER OF A MEMORY

FIELD OF THE DISCLOSURE

The present disclosure is generally related to storage devices.

BACKGROUND

Non-volatile memory devices, such as Universal Serial Bus (USB) Flash memory devices or removable storage cards, have allowed for increased portability of data and software applications. However, some regions of the memory array within the non-volatile memory may wear unevenly or may have defects that are not correctable, and identifying those regions and limiting further memory operations to those regions may be desirable.

SUMMARY

Systems and methods are disclosed to determine a rate of change of a performance parameter of a region of a non-volatile memory and perform an action in response to determining that the rate of change for the region satisfies a threshold. The rate of change may be a rate of change of an error count or a rate of change of another performance parameter, such as programming or erase voltages that may indicate increase with increased wear on the region of the non-volatile memory. The threshold may be a variable threshold, such as a "high water mark" that is based on an average rate of change of error counts or a rate of change of another performance parameter for the non-volatile memory. The threshold is used to differentiate between predicted performance of different regions of memory. When the rate of change for a particular performance parameter for the region satisfies the threshold, the region may be identified as a candidate for premature failure. A data storage device may identify one or more regions of the non-volatile memory as a non-used region based on the rate of change of the performance parameter corresponding to the one or more regions. Regions showing an increasing error rate trend that exceeds an acceptable threshold may be identified as candidates for premature failure and rendered inaccessible with respect to further memory read or write operations.

DETAILED DESCRIPTION

Figure 1:
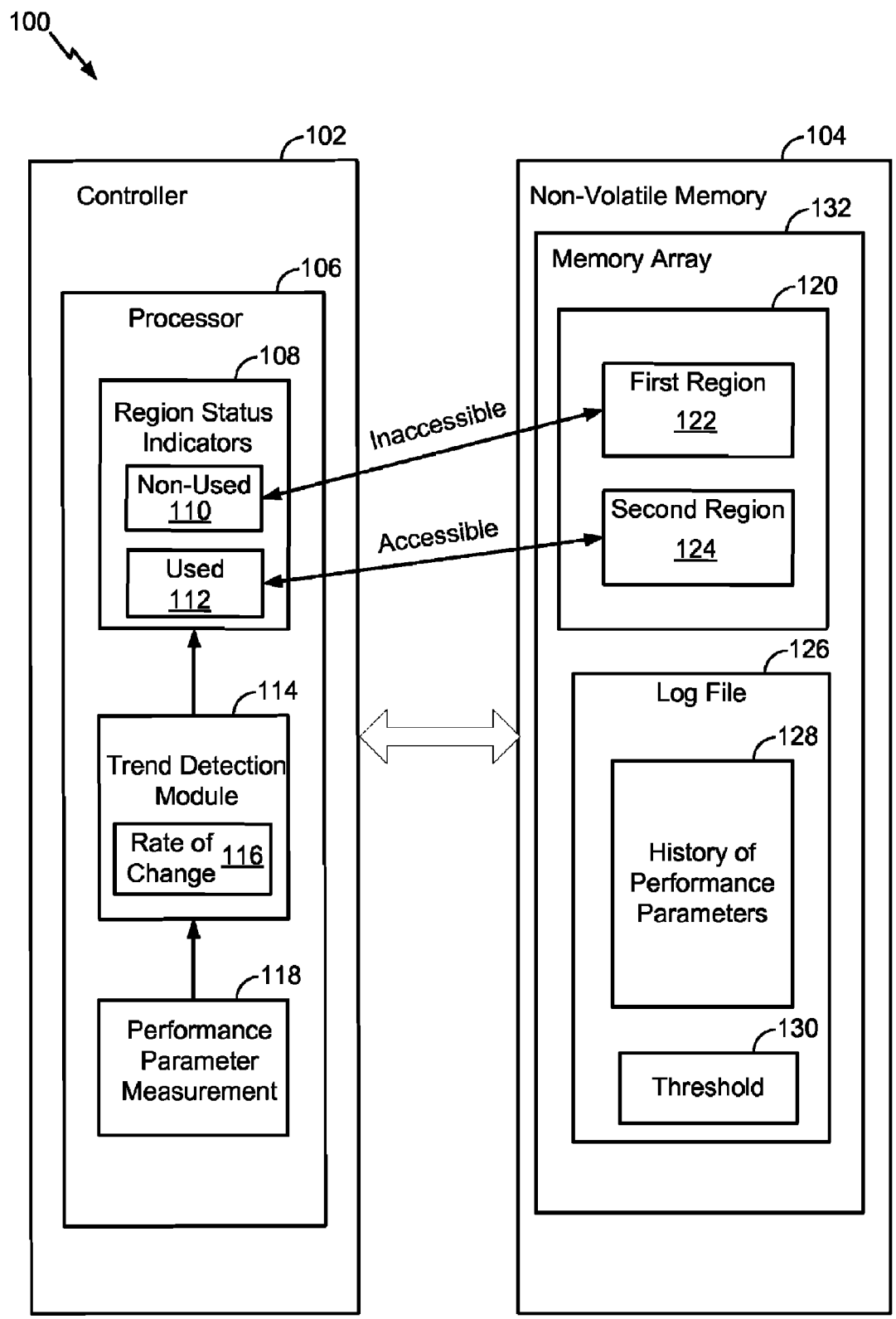
FIG. 1 is a block diagram of a first embodiment of a system of determining a rate of change of a performance parameter of a memory.

FIG. 1 depicts a particular embodiment of a system 100 of determining a rate of change of a performance parameter of a memory. The system 100 includes a controller 102 coupled to a nonvolatile memory 104. The controller 102 includes a processor 106. The processor 106 includes a region status indicator module 108 coupled to a trend detection module 114. The trend detection module 114 is coupled to a performance parameter measurement module 118. The region status indicator module 108 includes a non-used region status indicator 110 and a used region status indicator 112. The nonvolatile memory 104 includes a memory array 132. The memory array 132 includes a plurality of memory regions 120 including a first region 122 and a second region 124. The memory array 132 also includes a log file 126. The log file 126 includes a history of performance parameters 128 and a threshold 130.

The controller 102 is configured to selectively identify when at least one region (e.g., one of regions 122, 124) of the plurality of regions 120 of the memory array 132 should be identified by the non-used region status indicator 110 as a non-used region (i.e. designated as inaccessible) based on a rate of change of a performance parameter corresponding to the at least one region. A rate of change of the performance parameter may be determined at the trend detection module 114. For example, the trend detection module 114 may be implemented using a microprocessor programmed to determine a rate of change 116 of a performance parameter based on the history of performance parameters 128.

As an illustrative example, the processor 106 may be programmed to determine a rate of change of a performance parameter by determining a difference between values of the performance parameters from the history of performance parameters 128. The determined difference may be divided by an amount of elapsed time, such as by comparing time stamps or a number of write operations, erase operations, or power-on cycles between sequential parameter measurements, comparing the resulting time rate of change to a threshold, and generating a signal outputting a result of the comparison. The trend detection module 114 may include executable instructions that are stored at the non-volatile memory 104 and executed by the processor 106.

The at least one region (e.g., one of regions 122, 124) may be selectively identified as a non-used region and designated as inaccessible by the non-used status indicator 110 based on a result of a comparison of the rate of change of the performance parameter to a threshold provided by the non-volatile memory 104. The region identified as a non-used region may be retired or placed on probation as indicated by the non-used region status indicator 110 associated with the non-used region to render the non-used region inaccessible for memory access operations.

The threshold 130 may be a predetermined value stored in the non-volatile memory 104 at a time of manufacture or deployment. Alternatively, the threshold 130 may be an adjustable high water mark that is adjusted based on nominal performance parameters for a particular non-volatile memory device. For example, the high water mark may represent an average of error counts or some other performance parameter for the particular non-volatile memory 104. The high water mark may be updated to reflect increasing rates of change in error counts, wear indicators, or other performance parameters. Equating the threshold with a dynamic high water mark may prevent regions from being prematurely designated as non-used when the non-volatile memory exhibits unanticipated average values of performance parameters as a result of high use or events that may have affected error counts for the non-volatile memory 104.

To illustrate, at least one region may be selectively identified as a used region or as a non-used region at the region status indicator module 108. For example, the region status indicator module 108 may be implemented by using the processor 106 to determine a status of a region based on the rate of change of the performance parameter determined at the trend detection module 114. The processor 106 may be programmed to determine a status of a region and set one of the region status indicators 110, 112 by comparing the rate of change of the performance parameter to the threshold and generating a signal outputting a result of the comparison. The region status indicator module 108 may include executable instructions stored at the non-volatile memory 104 that are executed by the processor 106.

The performance parameter measurement module 118 may measure one or more parameters related to an error count, an error frequency, an erase voltage, a programming voltage, or any combination thereof, based on monitoring wear results of the non-volatile memory 104. The controller 102 may compare the rate of change of the one or more performance parameters to the threshold 130 provided by the memory 104. The controller 102 further may perform an action in response to determining that the rate of change satisfies the threshold. For example, the action may include identifying one of the regions 122, 124 of the non-volatile memory 104 inaccessible by assigning a probation status, a retired status, or another status rendering the region inaccessible.

The threshold 130, as previously described, may be a high water mark based on an average count of errors detected by an error-correcting code (ECC) engine with respect to the plurality of regions 120 of the memory array 132. When the rate of change 116 satisfies the threshold, such as based on a comparison indicating that the detected rate of change of the error count for a region exceeds a threshold rate of change, the region status indicator module 108 identifies that region as a non-used region. The region status indicator module 108 then causes the non-used region status indicator 110 to identify the region as non-used. Otherwise, if the rate of change does not exceed a threshold rate of change, such as when the rate of change falls within expected device wear tolerances, the used region status indicator 112 indicates that the memory region may continue to be used for memory read and write operations.

For purposes of example, it is assumed that the first region 122 has been identified as a non-used region and the non-used region status indicator 110 identifies the first region 122 as a non-used region, as shown in FIG. 1. The non-used first region 122 may be permanently inaccessible such that no further memory operations are permitted with the non-used first region 122. For example, permanently inaccessible regions may be marked as a retired region of the memory array 132. Alternatively, the non-used first region 122 may be temporarily inaccessible, and the non-used first region 122 may be reusable at a later time. For example, a wear result for the first region 122 may exceed the threshold 130 in a way that indicates that the first region 122 is correctable. The region status indicator module 108 may indicate that the first region 122 is a non-used region, but the controller 102 may mark the status of the non-used first region 122 as on probation so that the non-used first region 122 may be subsequently reused. For example, when the threshold 130 is a dynamic high water mark threshold, the threshold may increase during device usage to a level such that the first region 122 is returned to use.

During operation, the controller 102 monitors results of wear testing of the non-volatile memory 104. Performance parameters of the regions 122, 124 of the memory array 120 are measured and a history of the measured performance parameters is maintained in the history of performance parameters 128 of the log file 126. The trend detection module 114 receives performance parameter measurement information from the performance parameter measurement module 118 and determines a rate of change 116 of the measured performance parameter based on the received historical performance parameter data. The rate of change 116 of the performance parameter is compared to the threshold 130 retrieved from the memory array 132.

When the rate of change 116 satisfies the threshold 130, the region status indicator module 108 sets the non-used region status indicator 110 to identify the region as non-used. The non-used first region 122 is made inaccessible for further memory read and write operations. The non-used first region 122 may be permanently inaccessible such that no further memory reads or writes to the non-used first region 122 are permitted. Alternatively, the non-used first region 122 may be temporarily inaccessible, such that the non-used first region 122 may be used at a later time. If the rate of change 116 does not satisfy the threshold, then the used region status indicator 112 indicates that the first memory region 122 is a used region that is accessible for memory operations.

Figure 2:
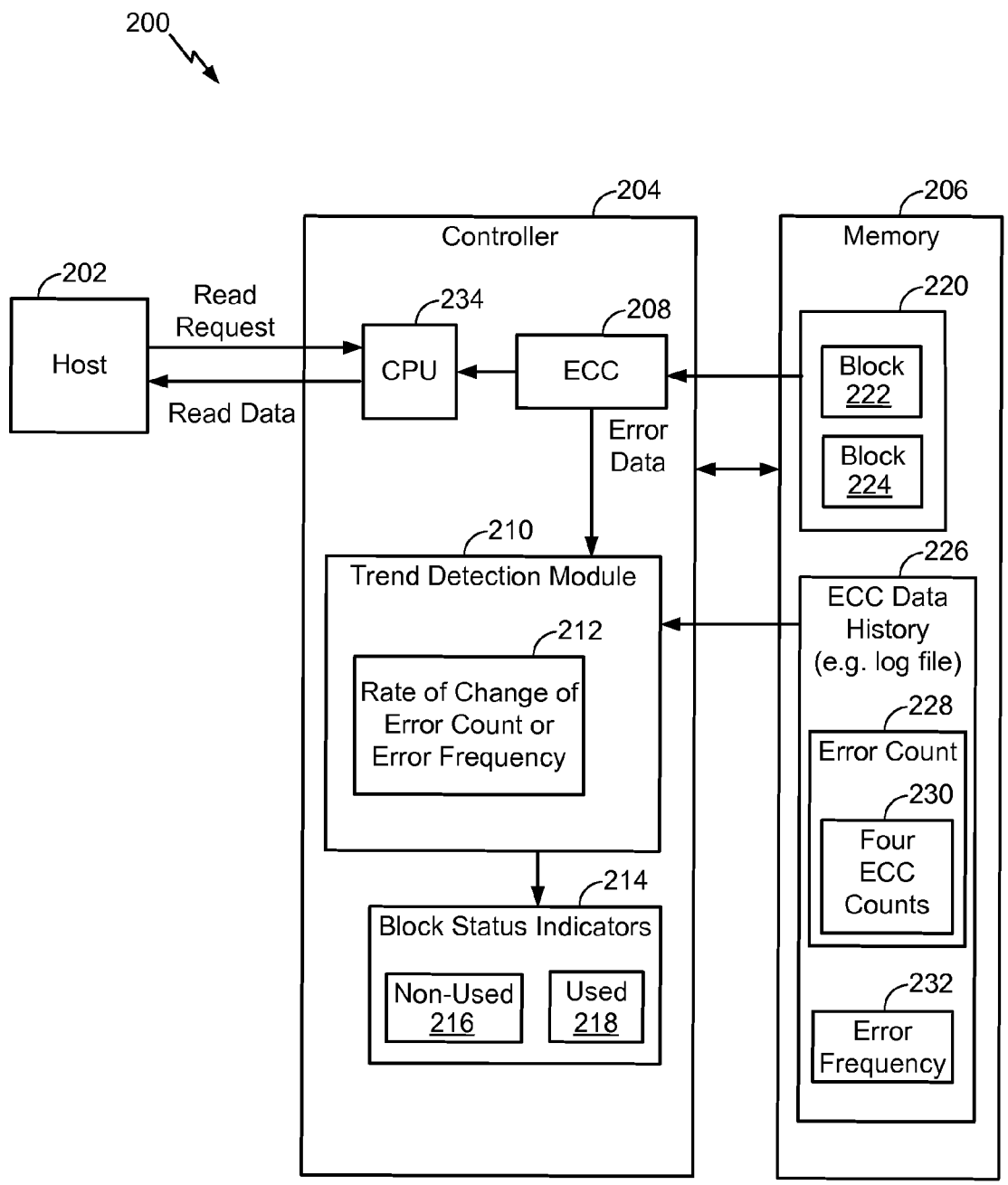
FIG. 2 is a block diagram of a second embodiment of a system of determining a rate of change of a performance parameter of a memory.

FIG. 2 depicts a second particular embodiment of a system 200 of determining a rate of change of a performance parameter of a memory 206. The system 200 includes a host 202 coupled to a controller 204. The controller 204 is coupled to a non-volatile memory 206, such as a flash memory.

The controller 204 includes a central processing unit (CPU) 234 coupled to receive memory requests, such as read requests, from the host 202. The CPU 234 is coupled to an error correcting code (ECC) engine 228. The ECC engine 228 is coupled to a trend detection module 210 and is also coupled to a plurality of blocks 220 of the non-volatile memory 206. The trend detection module 210 includes a rate of change module 212. The rate of change module 212 includes logic to calculate a rate of change of error count information or error frequency information. The trend detection module 210 is coupled to a block status indicator module 214 that includes a representative non-used memory block status indicator 216 and a representative used memory block status indicator 218.

The non-volatile memory 206 includes a plurality of memory blocks 220 including representative memory blocks 222 and 224. The non-volatile memory card 206 includes an ECC data history 226. The ECC data history 226 may be a log file of ECC data. The ECC data history 226 includes an error count module 228 including multiple ECC counts 230. For example, the ECC count module 228 may include a history of the four most recent error counts determined based on accessing a particular block of the non-volatile memory 206. A history of the four most recent ECC error counts for each of the blocks 220 in the non-volatile memory card 206 region is stored as a representative entry 230 in the error count module 228. The error count module 228 also includes an error frequency module 232.

The controller 204 is configured to determine a rate of change of a performance parameter of the non-volatile memory 206, to compare the rate of change to a threshold, and to perform an action in response to determining that the rate of change satisfies the threshold. The ECC count module 228 provides error data to the trend detection module 210. The error data may include error count data, error frequency data, or both error count data and error frequency data. The rate of change module 212 may determine the rate of change of the error data by evaluating the stored ECC counts 230 within the error count module 228 in the ECC data history 226. The error count data is retrievable from the data history 226 and may be input to the trend detection module 210 to determine the rate of change of the error count parameter for particular regions of the non-volatile memory 206.

The trend detection module 210 may be implemented by a microprocessor, such as by programming the CPU 234 to determine a rate of change of error data by determining a difference between error counts logged by the error count module 228 in the ECC data history 226. As an illustrative example, the CPU 234 may be programmed to determine a rate of change of error data by determining a difference between values of the ECC count data entries, such as data entry 230, from the ECC data history 226. The determined difference may be divided by an amount of elapsed time, such as by comparing time stamps or a number of write operations, erase operations, or power-on cycles between the sequential ECC counts. The CPU 234 may be programmed to compare the resulting rate of change in ECC counts to a threshold and to generate a signal outputting a result of the comparison. The trend detection module 210 may include executable instructions that are stored at the non-volatile memory 206 and executed by the CPU 234. Alternatively, the trend detection module 210 may be implemented as circuitry or dedicated hardware configured to perform the described calculations.

During operation, the host 202 provides a request to the CPU 234 of the controller 204 to request wear testing results of the non-volatile memory card 206. Performance parameters of the first block 222 and the second block 224 of the plurality of blocks 220 of the non-volatile memory 206 are measured and a history of the measured performance parameters is maintained in the ECC data history 226. For example, a representative entry 230 of the four most recent ECC error counts for each of the blocks 220 may be stored in the ECC data history 226. The performance parameters may include an error count or an error frequency. The trend detection module 210 receives performance parameter measurement information from the ECC data history 226 and determines a rate of change 212 of the performance parameter.

The rate of change 212 of the performance parameter is compared to a threshold. An example of the threshold is a high water mark. The high water mark may be based on an average error count of the plurality of blocks 220 in the non-volatile memory 206 that are detected by the ECC error count module 208. When the rate of change 212 satisfies the threshold, for example, for the first block 222 of the non-volatile memory 206, the block status indicator module 214 sets the non-used block status indicator 216 to identify the first block 222 as a non-used block. The non-used first block 222 is then inaccessible with respect to further memory operations. By contrast, if the rate of change 212 for a block of the non-volatile memory 206 does not satisfy the threshold, for example, the second block 224 of the non-volatile memory card 206, the block status indicator module 214 sets the used block status indicator 218 to identify the second block 224 as a used block. By the used block status indicator 218 identifying the second block 224 as a used block, the used second block 224 is designated as accessible for memory operations.

Figure 3:
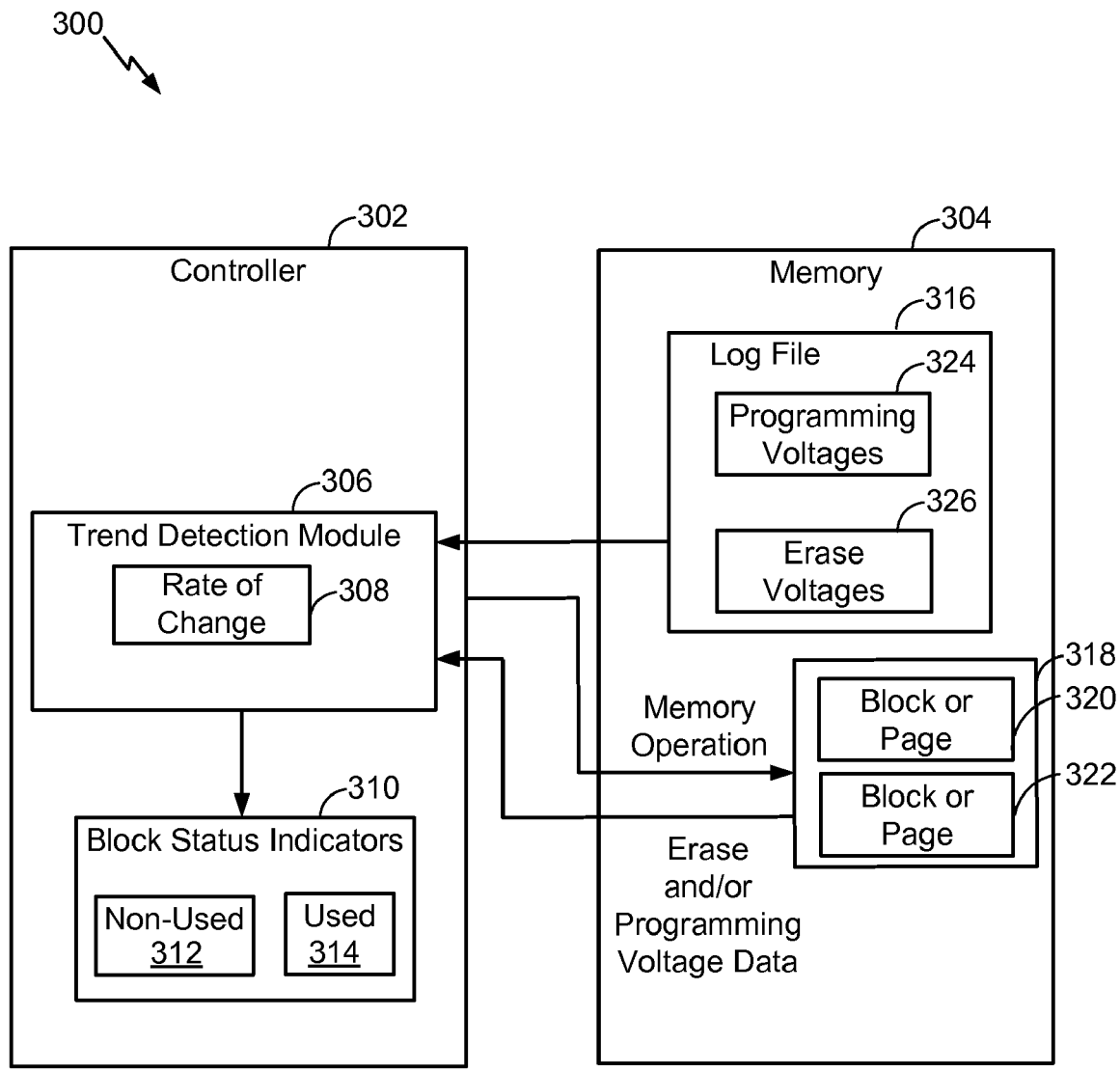
FIG. 3 is a block diagram of a third embodiment of a system of determining a rate of change of a performance parameter of a memory.

FIG. 3 depicts a particular embodiment of a system 300 of determining a rate of change of a performance parameter of a non-volatile memory 304. The system 300 includes a controller 302 coupled to the non-volatile memory 304. The controller 302 includes a trend detection module 306 including a rate of change module 308. The controller 302 includes a block status indicator module 310 including a representative non-used block status indicator 312 and a representative used block status indicator 314.

The non-volatile memory 304 includes a log file 316. The log file 316 includes performance parameters, such as programming voltages 324, erase voltages 326, or programming voltages 324 and erase voltages 326. The non-volatile memory 304 includes a plurality of memory regions 318 including representative memory regions 320 and 322. Each of the memory regions 318 may be a block, a page, or another division of the non-volatile memory 304.

The rate of change module 308 includes logic to calculate a rate of change of programming voltage information or erase voltage information. The trend detection module 306 is coupled to a block status indicator module 310 that includes the non-used memory block status indicators 312 and the used memory block status indicators 314. The controller 302 is configured to determine a rate of change of a performance parameter of the memory 304, to compare the rate of change to a threshold, and to perform an action in response to determining that the rate of change satisfies the threshold. The trend detection module 306 may be implemented by programming the controller 302 to determine a rate of change by determining a difference between erase and/or programming voltage data resulting from a particular memory operation initiated by the controller 302, as compared to programming voltages 324, erase voltages 326, or programming voltages 324 and erase voltages 326 logged in the log file 316. The determined difference may be divided by an amount of elapsed time, such as by comparing time stamps, or a number of write operations, erase operations, or power-on cycles between programming voltages 324, erase voltages 326, or programming voltages 324 and erase voltages 326 and to compare the resulting time rate of change to a threshold. A signal is generated outputting a result of the comparison. The trend detection module 306 may include executable instructions that are stored in the non-volatile memory 304 and executed by the controller 302.

During operation, the controller 302 may compare a rate of change of a performance parameter of the nonvolatile memory 304 to an adjustable threshold, and to modify the adjustable threshold in response to a number of comparisons of the rate of change of the performance parameter that satisfy the adjustable threshold. The trend detection module 306 receives a history of performance parameter values for monitored performance parameters from the log file 316. The trend detection module 306 determines the rate of change of each of the performance parameters such as one or more of the programming voltages 324 and the erase voltages 326 based on a result of a recent memory operation. The trend detection module 306 then performs an action such as identifying a block or page of the nonvolatile memory 318 as a used block or page or as a non-used block or page as a result of an evaluation of the rate of change of each of the performance parameters 324, 326.

Figure 4:
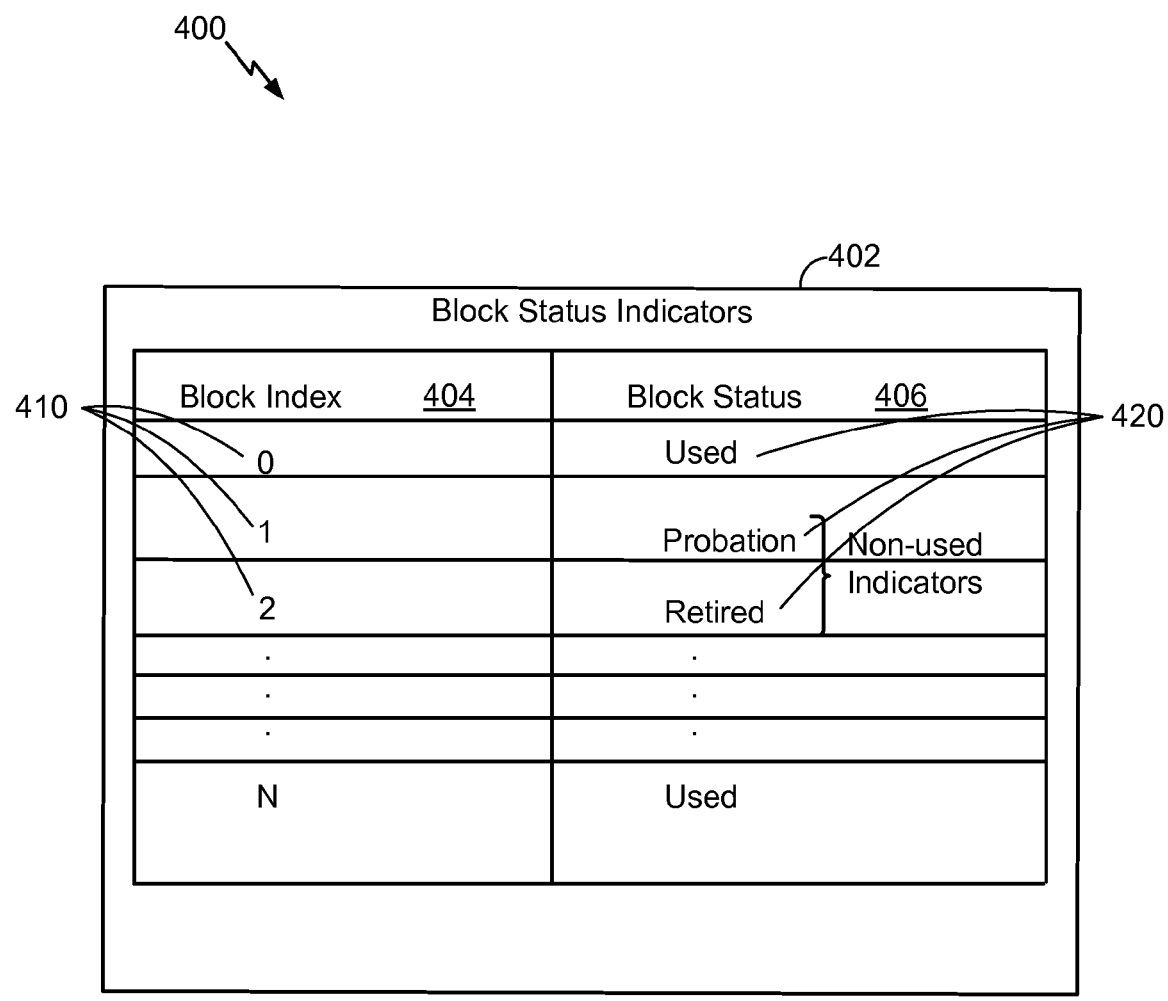
FIG. 4 is a diagram illustrating a table storing block status indicators of a system that determines a rate of change of a performance parameter of a memory.

FIG. 4 illustrates a memory table 400 that includes a block status indicator page 402 having a block index 404 and a block status 406. The block index 404 lists identifiers 410 for particular blocks of memory and, for each of the listed blocks in the block index 404, the block status 406 lists a status indicator 410. The status indicator 420 indicates whether each of the blocks identified by the list identifiers 410 is a used block or a non-used block. Thus, taking FIG. 2 as an illustrative example, the non-used block status indicator 216 identifying the first block 222 as non-used would be manifested as an entry in the memory table 400. The block index 404 would list an identifier 410 for the first block 222 with a corresponding status indicator 420 listed in the block status 406. The status indicator 420 would include one of the non-used indicators, as described further below. By contrast, in the memory table 400, the block index would list an identifier 410 for the second block 224 with a corresponding used block status indicator 420 in the block status 406 column.

Non-used blocks may be blocks on probation or retired. As described with reference to FIG. 1, a non-used block identified as being on probation is determined to be potentially unreliable, but may be used under limited circumstances. For example, when a block of memory is marked as on probation, the block may be permitted to be re-used a predetermined number of times or upon detection of a condition indicating a return to a satisfactory performance. By contrast, a block of memory designated as retired is considered to be unusable and is permanently inaccessible for further memory operations.

Figure 5:
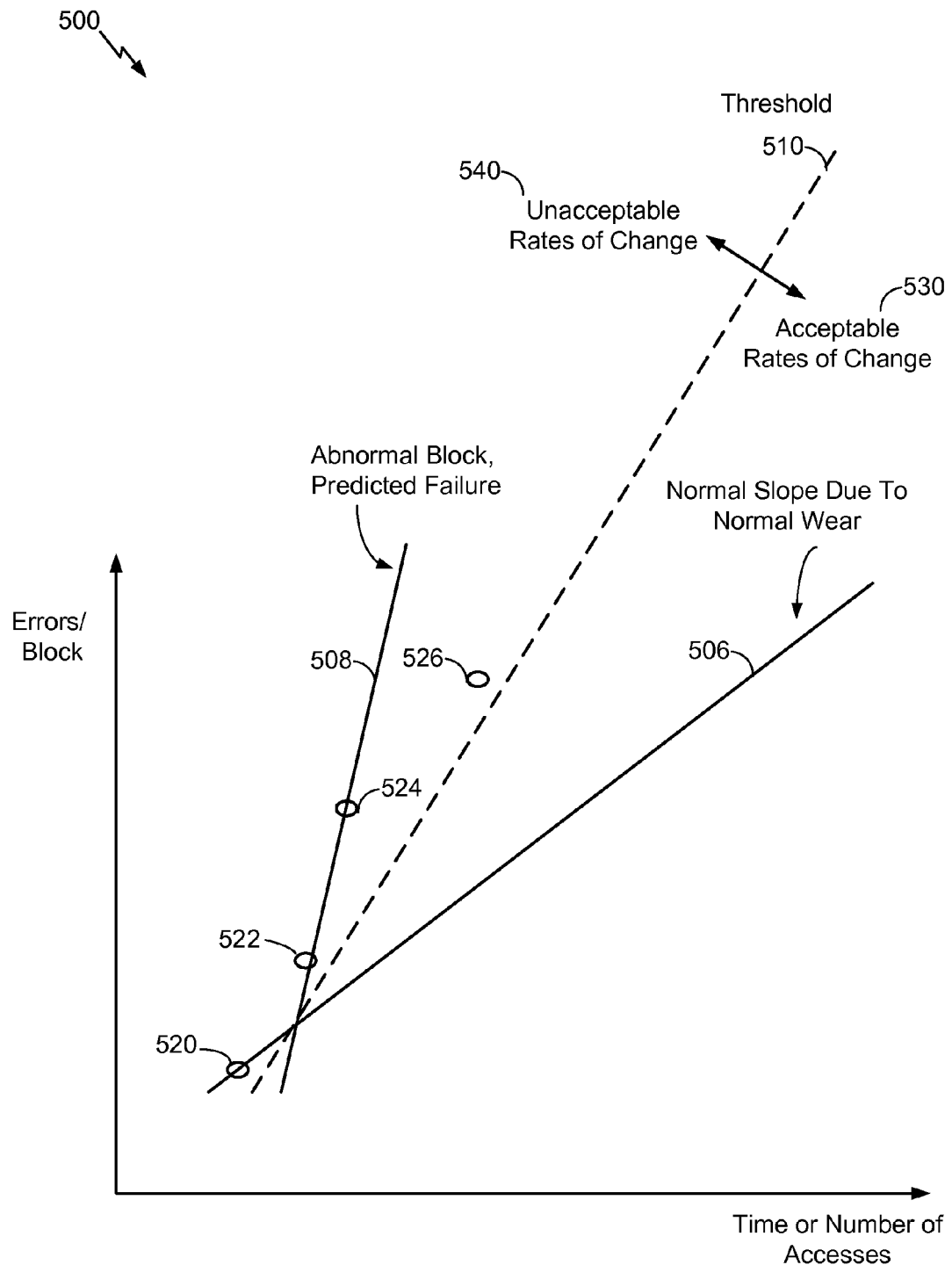
FIG. 5 is a diagram illustrating error correcting code counts used to determine a rate of change of a performance parameter of a memory.

FIG. 5 depicts a graph 500 of rates of change of performance parameters, such as ECC counts, as shown in FIG. 5, or programming voltage and erase voltage counts used to evaluate integrity of regions, blocks, or other divisions of memory in a memory device. The graph 500 provides an example of how rates of change are compared for error counts against known thresholds. However, it should be appreciated that a system making such a determination would do so based on numerical values representing the rates of change rather than on a visual representation of those rates of change as depicted in FIG. 5.

A number of errors for a single region of the memory array are shown as error counts 520, 522, 524, 526. For example, An ECC module 228 (FIG. 2) may provide the error count for each of a number of memory accesses to the region. Over time or number of accesses, rates of change of the error counts are determined and compared to a threshold to determine whether the region should be identified as non-used.

As in the representative entry 230 in the ECC data history 226 (FIG. 2), the four ECC counts 520, 522, 524, 526 may correspond to the four most recent ECC counts determined based on accessing a particular region of the non-volatile memory. The particular region may be a particular block, page, or other division of the non-volatile memory. The four ECC counts 520, 522, 524, 526 taken over time (or number of accesses) may be graphed and connected by a line 508. A slope of the line 508 indicates a rate of change of the error counts 520, 522, 524, 526. The rate of change between the ECC counts 520, 522, 524, 526 may not be constant. The slope of the line, or the representative rate of change, thus may be an average of the rates of change between ECC counts. As another example, the line 508 may be a regression line. The rate of change also may be taken as the greatest rate of change between any of the ECC counts 520, 522, 524, 526 in a more critical representation of the ECC counts. As illustrated, the line 508 represents a greatest rate of change between ECC counts, between ECC count 522 and ECC count 526.

The rate of change of the ECC counts 520, 522, 524, 526, the rate of change for the region of interest may be compared to a threshold, represented graphically as 510, that delineates between an area including acceptable rates of change 530 and an area including unacceptable rates of change 540. For example, a line 506 represents a rate of change of ECC counts attributable to normal wear. The line 506 has a slope that is less than that of the threshold 510. Based on the comparison of the line 506 to the threshold 510, the division of memory represented by the line 506 would continue to be considered a used division of memory. The threshold 510 may be a dynamic high water mark. As previously described with reference to FIG. 1, equating the threshold 510 with the high water mark enables the threshold to vary based on an average error count of a plurality of regions of a memory array in the non-volatile memory.

By contrast, the line 508 has a greater slope than the threshold 510. Because the rate of change represented by the line 508 exceeds the threshold 510 rate of change, the region of memory represented by the line 508 may be considered to be likely to fail and may be marked as non-used. Initially, the region may be identified as on probation so that it can be used a few more times if the space is needed, then later identified as permanently inaccessible for future memory operations. Under certain circumstances, the probationary status may return to a used status. For example, in the next few accesses, the line 508 may return to the area 530 indicating an acceptable rate of change, and the region associated with the line may be reclassified as "used." As another example, when the threshold 510 is a high water mark, the threshold 510 may be adjusted past the line 508 so that the line 508 no longer represents an unacceptable rate of change so that a probationary status of the region can be changed to a used status. Alternatively, if the slope of the line 508 is much greater than the threshold 510, the represented division of memory may be immediately regarded as permanently inaccessible for memory operations.

Figure 6:
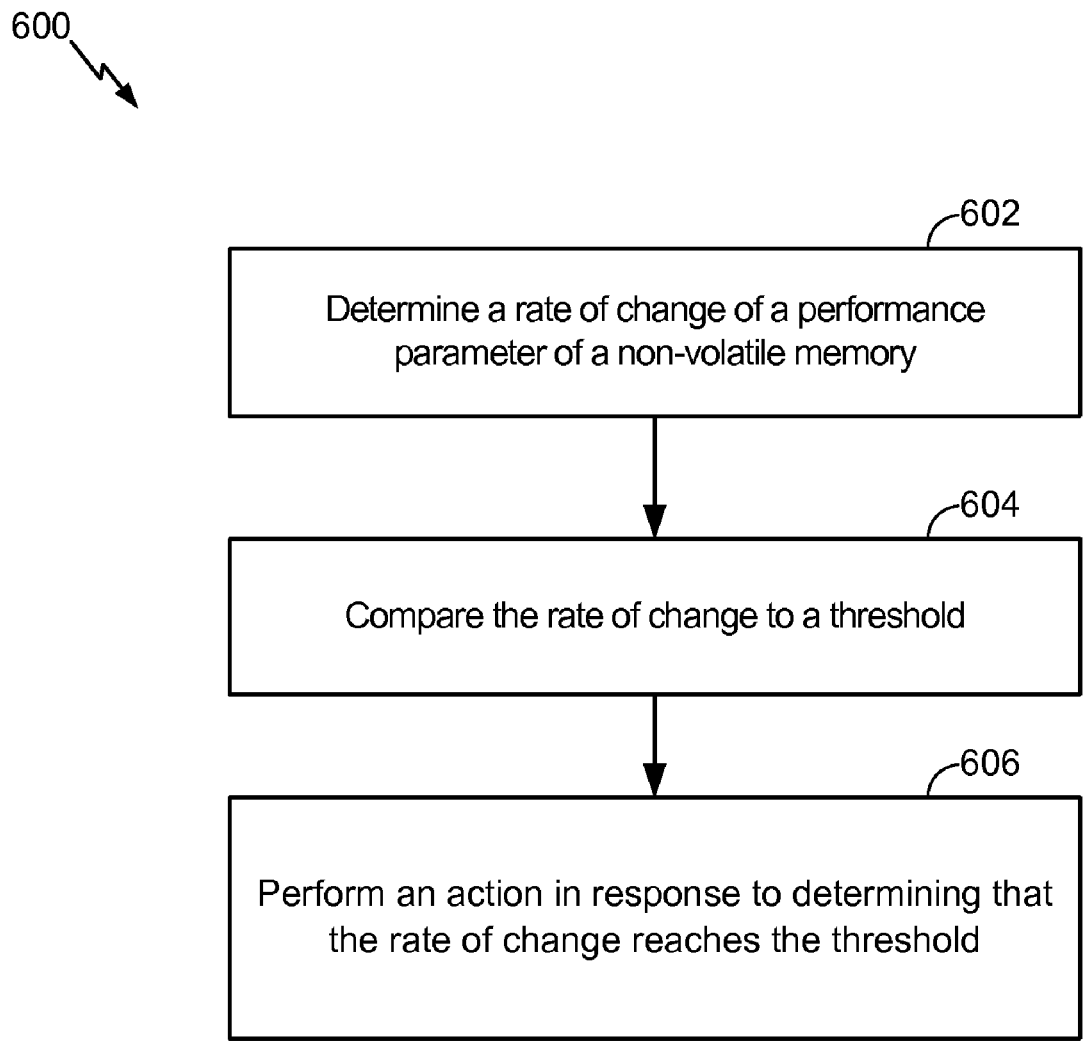
FIG. 6 is a flow diagram of a first embodiment of a method of determining a rate of change of a performance parameter of a memory.

FIG. 6 depicts a first particular embodiment of a method of responding to a rate of change of a performance parameter of a non-volatile memory. As illustrative, non-limiting examples, and the method 600 may be performed at the controller 102 of FIG. 1, the controller 204 of FIG. 2, or the controller 302 of FIG. 3.

A rate of change of a performance parameter of a non-volatile memory is determined, at 602. For example, the rate of change may be determined at the trend detection module 114 of FIG. 1. The rate of change may be determined by a controller 102, 202, 302, or by a particular component such as a processor 106 (FIG. 1) or a CPU 234 (FIG. 2) executing stored instructions and based on performance parameter data stored in log files, as described with reference to FIGS. 1-3. As described with reference to FIG. 4, the rate of change may be an average rate of change of all stored performance parameters for a region of memory being evaluated. Alternatively, the rate of change may discard outlying measurements and may determine a greatest rate of change, a lowest rate of change, or some other selected rate of change that may be derived from the stored performance parameters. The performance parameter may include one or more parameters related to an error count or an error frequency, as described with respect to the system 200 of FIG. 2. The performance parameter also may include an erase voltage, a programming voltage, or an erase voltage and a programming voltage, as described with respect to the system 300 of FIG. 3. The performance parameter also may include some combination of error measurements, voltages, one or more other performance parameters, or any combination thereof.

The rate of change is compared to a threshold, at 604. The comparison may be made by a controller 102, 202, 302, such as by the processor 106 running the trend detection module 114, by a comparator, or by another comparison mechanism.

An action is performed in response to determining that the rate of change satisfies the threshold, at 606. For example, the action may include identifying a region, such as a block or a page of non-volatile memory being evaluated as non-used, as described with reference to FIGS. 1-3. A non-used region status indicator 110 (FIG. 1) or a non-used block status indicator 216 (FIG. 2) may be set in a memory table 402 (FIG. 4) to indicate that the region of memory is not to be used for memory operations. The non-used region of memory may be assigned a probation status, so that the region may be used a few more times when necessary, or a retired status, identifying the region as permanently unusable, as described with respect to FIG. 4.

The non-volatile memory may be a flash memory and determining the rate of change, comparing the rate of change to the threshold, and performing the action may occur at a controller of the flash memory. By performing an action based on the rate of change satisfying the threshold, a rate of performance degradation that exceeds an expected device wear may be detected. Affected regions of the non-volatile memory can be retired or monitored with increased diligence to prevent data loss associated with a potential failure occurring in the affected regions.

Figure 7:
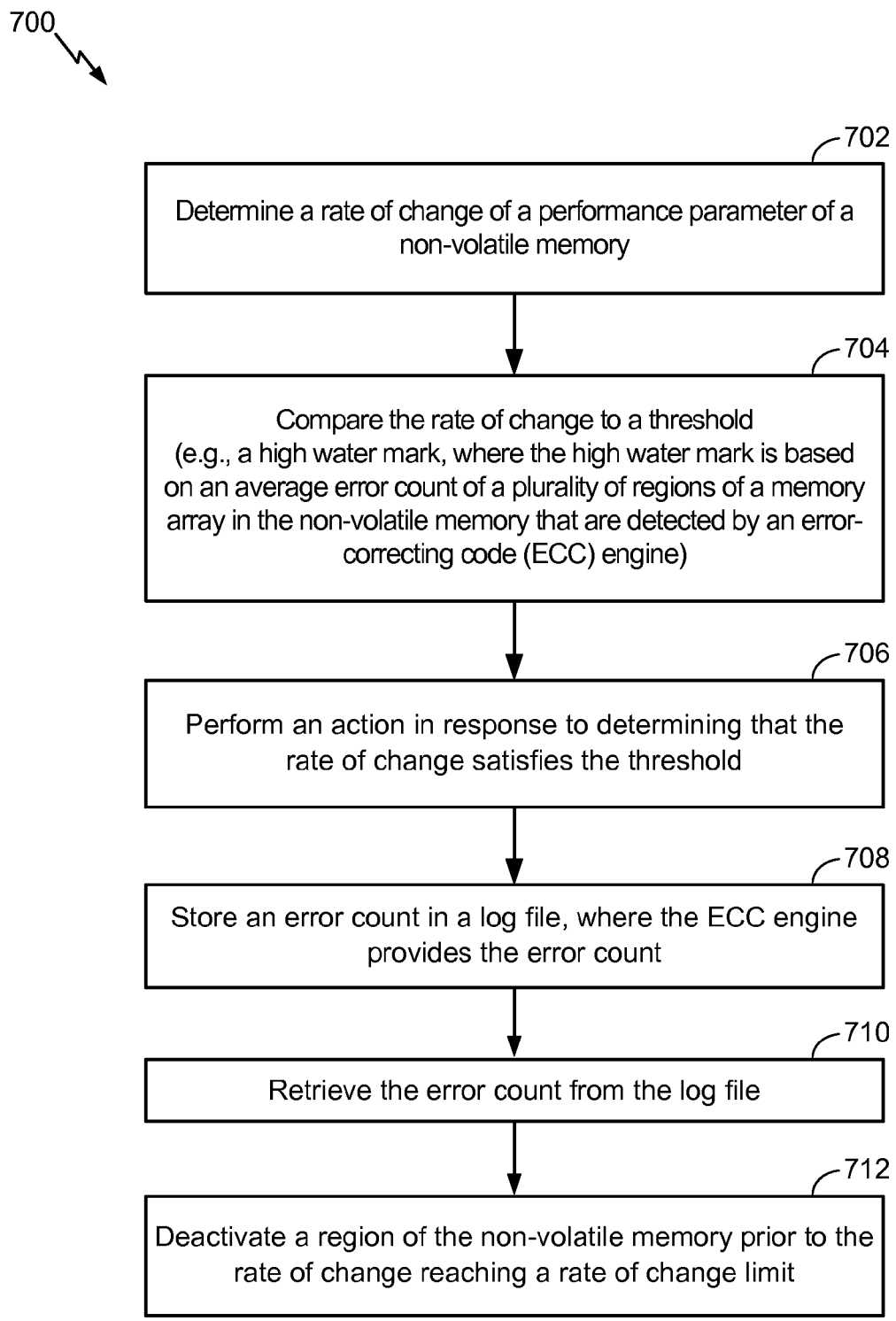
FIG. 7 is a flow diagram of a second particular embodiment of a method of determining a rate of change of a performance parameter of a memory.

FIG. 7 depicts a second particular embodiment of a method of responding to a rate of change of a performance parameter of a non-volatile memory. As illustrative, non-limiting examples, the method 700 may be performed at the controller 102 of FIG. 1, the controller 204 of FIG. 2, or the controller 302 of FIG. 3.

A rate of change of a performance parameter of a non-volatile memory is determined, at 702. For example, the rate of change may be determined at the trend detection module 114 of FIG. 1. The performance parameter may be an error count or an error frequency. To illustrate, an error-correcting code (ECC) engine may provide the error count, such as the ECC engine 208 of FIG. 2.

The rate of change is compared to a threshold, at 704. For example, the threshold may be a high water mark that may be adjustable. The high water mark may be based on an average error count of a plurality of regions of a memory array in the non-volatile memory.

An action is performed in response to determining that the rate of change satisfies the threshold, at 706. For example, the region of the non-volatile memory may be as retired or probationary, as described with respect to FIG. 4. The error count may be stored in a log file, at 708. As an example, four most recent ECC counts may be stored in the log file at the non-volatile memory. The four ECC counts may correspond to the four most recent ECC counts determined based on accessing a particular region of the non-volatile memory, such as a particular block, page, or other division of the non-volatile memory.

The error count may be retrieved from the log file, at 710, and a region of the non-volatile memory may be deactivated prior to the rate of change reaching a rate of change limit, at 712. For example, where four ECC counts are stored in the log file, the rate of change may be determined by evaluating each of the four stored ECC counts. The rate of change may be determined based on a slope of a line determined based on each of the four stored ECC counts. Alternatively, as described with reference to FIG. 4, the rate of change may be a largest slope of a line between two ECC counts in the log file that correspond to a single region of the non-volatile memory.

When the rate of change exceeds the high water mark, a region of the non-volatile memory may be marked as retired. The region may be a block of the non-volatile memory or a page of the non-volatile memory, as non-limiting examples. Alternatively, when the rate of change exceeds the high water mark, a region of the non-volatile memory is marked as probationary. A region marked as probationary may be temporarily unavailable for use, or may be re-usable a predetermined number of times and when the predetermined number of times is reached, the region is marked as retired.

Figure 8:
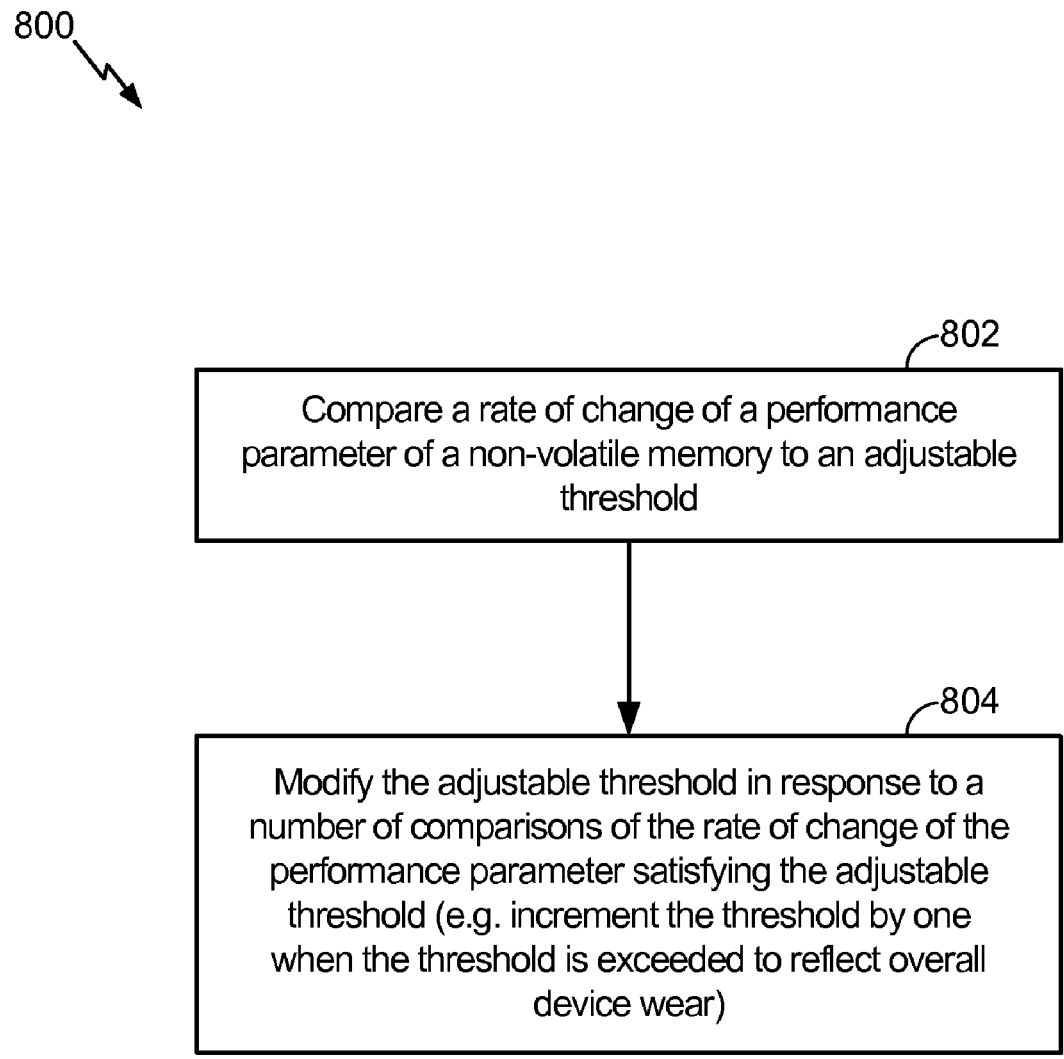
FIG. 8 is a flow diagram of a third embodiment of a method of comparing a rate of change of a performance parameter to an adjustable threshold of a memory.

FIG. 8 depicts a third particular embodiment of a method of responding to a rate of change of a performance parameter of a non-volatile memory. As illustrative, non-limiting examples, the method 800 may be performed at the controller 102 of FIG. 1, the controller 204 of FIG. 2, or the controller 302 of FIG. 3.

A rate of change of a performance parameter of a non-volatile memory is compared to an adjustable threshold, at 802. For example, the rate of change may be determined at a controller of the non-volatile memory, such as at the trend detection module 114 of FIG. 1. The performance parameter may include one or more parameters related to an error count or an error frequency, as described with respect to the system 200 of FIG. 2, an erase voltage or a programming voltage, as described with respect to the system 300 of FIG. 3, or any combination thereof.

The adjustable threshold is modified in response to a number of comparisons of the rate of change of the performance parameter satisfying the adjustable threshold, at 804. The threshold may be adjusted multiple times. For example, the threshold may be adjusted each time a region of the non-volatile memory is retired. By adjusting the threshold each time a region is retired, the threshold may adapted in accordance with an increasing overall wear of the non-volatile memory device to reduce a subsequent number of regions exhibiting a rate of change of performance parameters satisfying the adjusted threshold.

Figure 9:
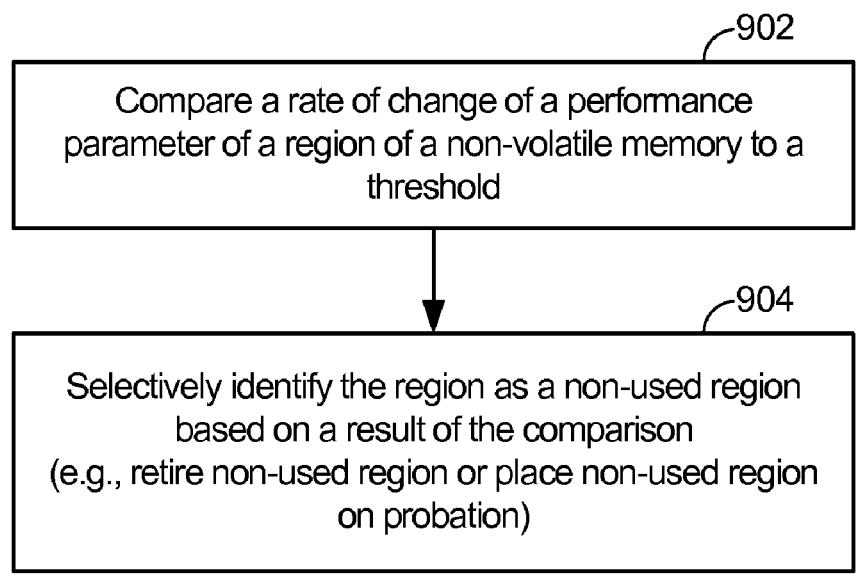
FIG. 9 is a flow diagram of a fourth embodiment of a method of determining a rate of change of a performance parameter of a memory.

FIG. 9 depicts a fourth particular embodiment of a method of responding to a rate of change of a performance parameter of a non-volatile memory. As illustrative, non-limiting examples, the method 900 may be performed at the controller 102 of FIG. 1, the controller 204 of FIG. 2, or the controller 302 of FIG. 3.

A rate of change of a performance parameter of a region of a non-volatile memory is compared to a threshold, at 902. For example, the rate of change may be determined at controller of the non-volatile memory, such as at the trend detection module 114 of FIG. 1. The performance parameter may include one or more parameters related to an error count or an error frequency, as described with respect to the system 200 of FIG. 2, an erase voltage or programming voltage, as described with respect to the system 300 of FIG. 3, or any combination thereof.

The region may be selectively identified as a non-used region based on a result of the comparison, at 904. For example, the non-used region may be retired or placed on probation. A region status indicator associated with the non-used region may render the non-used region inaccessible for memory access operations.

Figure 10:
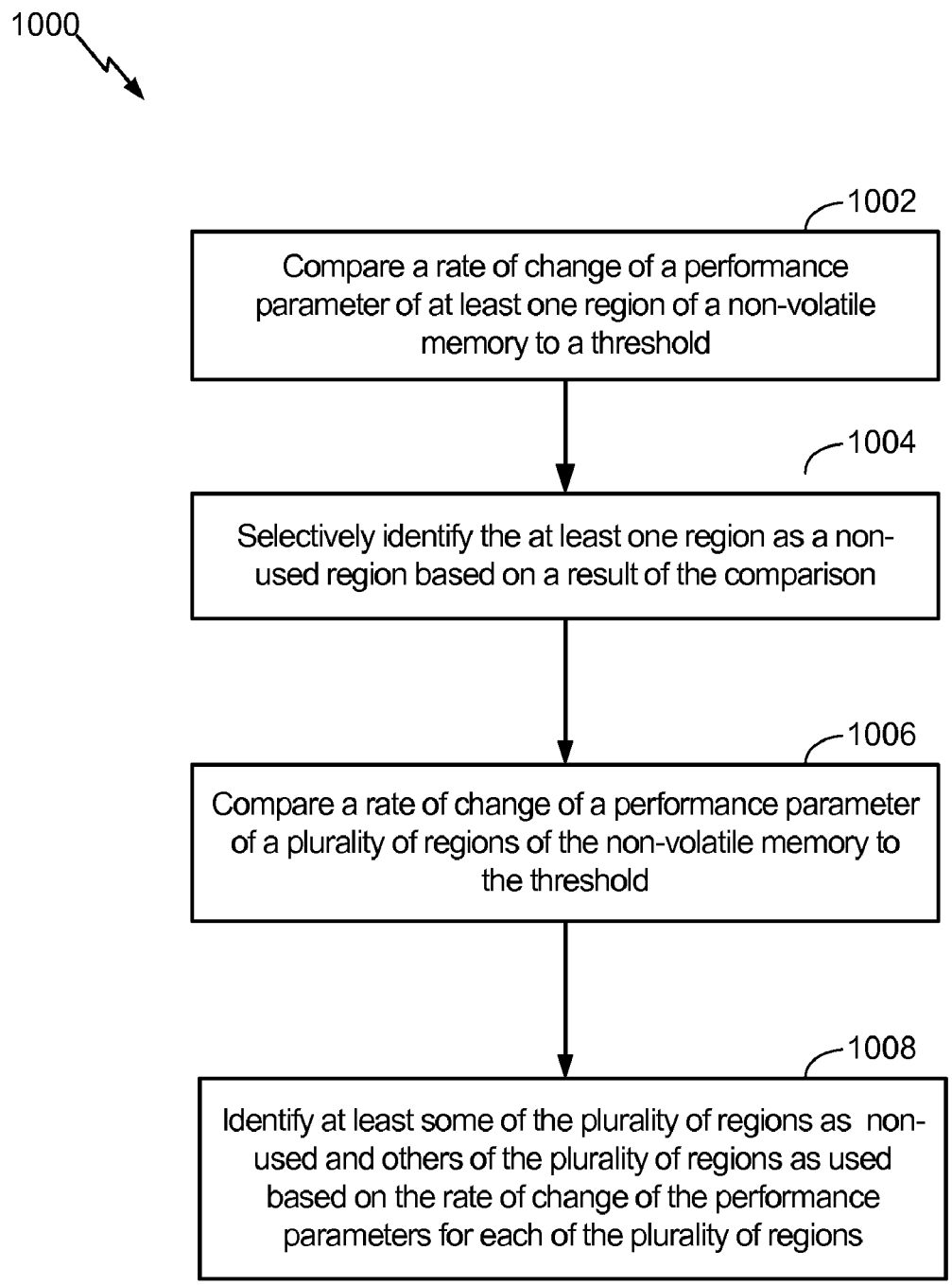
FIG. 10 is a flow diagram of a fifth embodiment of a method of determining a rate of change of a performance parameter of a memory.

FIG. 10 depicts a fourth particular embodiment of a method of responding to a rate of change of a performance parameter of a non-volatile memory. As illustrative, non-limiting examples, the method 1000 may be performed at the controller 102 of FIG. 1, the controller 204 of FIG. 2, or the controller 302 of FIG. 3.

A rate of change of a performance parameter of a region of a non-volatile memory is compared to a threshold, at 1002.

For example, the rate of change may be determined at controller of the non-volatile memory, such as at the trend detection module 114 of FIG. 1. The performance parameter may include one or more parameters related to an error count or an error frequency, as described with respect to the system 200 of FIG. 2, an erase voltage or programming voltage, as described with respect to the system 300 of FIG. 3, or any combination thereof.

The region may be selectively identified as a non-used region based on a result of the comparison, at 1004. For example, the non-used region may be retired or placed on probation, and a status indicator associated with the non-used region, such as the region status indicators 108 of FIG. 1, may render the non-used region inaccessible for memory access operations.

A rate of change of a performance parameter of a plurality of regions of the non-volatile memory may be compared to the threshold, at 1006. At least some of the plurality of regions may be identified as non-used and others of the plurality of regions may be identified as used based on the rate of change of the performance parameters for each of the plurality of regions, at 1008.

Although various components depicted herein are illustrated as block components and described in general terms, such components may include one or more microprocessors, state machines, or other circuits configured to enable the controller 102 of FIG. 1, the controller 204 of FIG. 2, or the controller 302 of FIG. 3 to perform the particular functions attributed to such components, or any combination thereof. For example, the region status indicator module 108, the trend detection module 114, the performance parameter measurement module 118, or any combination thereof, of FIG. 1 may represent physical components, such as hardware controllers, state machines, logic circuits, or other structures to enable the controller 102 of FIG. 1 to determine a rate of change in a performance parameter, compare the rate of change to a threshold, and perform an action based on a result of the comparison.

For example, the trend detection module 114 may be implemented using a microprocessor or microcontroller programmed to determine a rate of change 116 based on a performance parameter measurement and/or the history of performance parameters 128. To illustrate, the microprocessor or microcontroller, such as the processor 106, may be programmed to receive multiple values of the performance parameter and to determine a difference between sequential parameter measurements by subtracting the parameter values. The microprocessor or microcontroller may be programmed to determine a time rate of change by dividing the determined difference by an amount of elapsed time, such as by comparing time stamps or a number of write operations, erase operations, or power-on cycles between the sequential parameter measurements and to compare the resulting time rate of change to a threshold and generate a signal outputting a result of the comparison. In a particular embodiment, the trend detection module 114 includes executable instructions that are executed by the processor 106 and the instructions are stored at the non-volatile memory 104. Alternatively, or in addition, executable instructions that are executed by the processor 106 that may be included in the trend detection module 114 may be stored at a separate memory location that is not part of the non-volatile memory 104, such as at a read-only memory (ROM) (not shown).

The systems depicted in FIGS. 1-3, such as the system 100 of FIG. 1, may be a portable device configured to be selectively coupled to one or more external devices, such as the host device 202 of FIG. 2. However, in other embodiments, the system 100 may be attached or embedded within one or more host devices, such as within a housing of a portable communication device. For example, the system 100 may be within a packaged apparatus such as a wireless telephone, personal digital assistant (PDA), gaming device or console, portable navigation device, or other device that uses internal non-volatile memory. The multimedia storage device 502 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    determining a rate of change of a performance parameter of a region of a memory, wherein the rate of change is a largest slope of a line of multiple lines, wherein each of the multiple lines is determined based on two or more performance parameter measurements that are associated with the region of the memory;
    comparing the rate of change to a threshold; and
    performing an action in response to determining that the rate of change satisfies the threshold.

2. The method of claim 1, wherein the performance parameter is an error count.

3. The method of claim 2, wherein an error-correcting code (ECC) engine provides the error count.

4. The method of claim 1, further comprising storing a history of performance parameter measurements in a log file, the history of performance parameter measurements including the two or more performance parameter measurements.

5. The method of claim 4, wherein the memory comprises a non-volatile memory and further comprising storing four ECC counts in the log file at the non-volatile memory.

6. The method of claim 5, wherein the rate of change is determined by evaluating each of the four stored ECC counts.

7. The method of claim 1, wherein the performance parameter is a programming voltage.

8. The method of claim 1, wherein the performance parameter is an erase voltage.

9. The method of claim 1, wherein the memory is a flash memory, and wherein determining the rate of change, comparing the rate of change to the threshold, and performing the action occur at a controller of the flash memory.

10. The method of claim 1, wherein the threshold is a high water mark.

11. The method of claim 10, wherein the high water mark is adjustable.

12. The method of claim 10, wherein the high water mark is based on an average error count of a plurality of regions of a memory array in the memory.

13. The method of claim 10, wherein when the rate of change exceeds the high water mark, the region of the memory is marked as retired.

14. The method of claim 13, wherein the region is a block of the memory.

15. The method of claim 13, wherein the region is a page of the memory.

16. The method of claim 13, wherein the region is re-usable a predetermined number of times and when the predetermined number of times is reached, the region is marked as retired.

17. The method of claim 10, wherein when the rate of change exceeds the high water mark, the region of the memory is marked as probationary.

18. The method of claim 17, wherein the region is a block of the memory.

19. The method of claim 17, wherein the region is a page of the memory.

20. The method of claim 17, wherein the region marked as probationary is temporarily unavailable for use.

21. The method of claim 1, further comprising deactivating the region of the memory prior to the rate of change reaching a rate of change limit.

22. A method comprising:
comparing a rate of change of a performance parameter of a memory to an adjustable threshold, wherein the rate of change is a largest slope of a line of multiple lines, wherein each of the multiple lines is determined based on two or more performance parameter measurements that are associated with a region of the memory; and
modifying the adjustable threshold in response to a number of comparisons of the rate of change of the performance parameter satisfying the adjustable threshold.

23. The method of claim 22, wherein the adjustable threshold is adjusted each time a particular region of the memory is retired.

24. The method of claim 22, wherein the adjustable threshold is adjusted multiple times.

25. A method comprising:
performing a comparison of a rate of change of a performance parameter of a region of a memory to a threshold, wherein the rate of change is a largest slope of a line of multiple lines, wherein each of the multiple lines is determined based on two or more performance parameter measurements that are associated with the region of the memory; and
selectively identifying the region as a non-used region based on a result of the comparison.

26. The method of claim 25, wherein the non-used region is retired or is placed on probation.

27. The method of claim 25, further comprising comparing a rate of change of a performance parameter of a plurality of regions of the memory to the threshold, wherein at least some of the plurality of regions are identified as non-used and others of the plurality of regions are identified as used based on the rate of change of the performance parameters for each of the plurality of regions.

28. A data storage device comprising:
a controller; and
a memory array including a plurality of regions;
wherein the controller is configured to selectively identify at least one region of the plurality of regions as a non-used region based on a rate of change of a performance parameter of the at least one region, wherein the rate of change is a largest slope of a line of multiple lines, wherein each of the multiple lines is determined based on two or more performance parameter measurements that are associated with the at least one region of the memory.

29. The data storage device of claim 28, wherein the non-used region is inaccessible.

30. The data storage device of claim 28, wherein the non-used region is permanently inaccessible.

31. The data storage device of claim 28, wherein the non-used region is temporarily inaccessible.

32. The data storage device of claim 28, wherein the at least one region of the plurality of regions is a block of the memory.

33. The data storage device of claim 28, wherein the at least one region of the plurality of regions is a page of the memory.

34. The method of claim 1, wherein the performance parameter is an error frequency.

35. A method comprising:
determining a rate of change of a performance parameter of a region of a memory, wherein the rate of change is a slope of a regression line determined based on multiple performance parameter measurements that are associated with the region of the memory;
comparing the rate of change to a threshold; and
performing an action in response to determining that the rate of change satisfies the threshold.

36. A method comprising:
comparing a rate of change of a performance parameter of a memory to an adjustable threshold, wherein the rate of change is a slope of a regression line determined based on multiple performance parameter measurements that are associated with a region of the memory; and
modifying the adjustable threshold in response to a number of comparisons of the rate of change of the performance parameter satisfying the adjustable threshold.

37. A method comprising:
performing a comparison of a rate of change of a performance parameter of a region of a memory to a threshold, wherein the rate of change is a slope of a regression line determined based on multiple performance parameter measurements that are associated with the region of the memory; and
selectively identifying the region as a non-used region based on a result of the comparison.

38. A data storage device comprising:
a controller; and
a memory including a plurality of regions;
wherein the controller is configured to selectively identify at least one region of the plurality of regions as a non-used region based on a rate of change of a performance parameter of the at least one region, wherein the rate of change is a slope of a regression line determined based on multiple performance parameter measurements that are associated with the region of the memory.

* * * * *